United States Patent
Gambetta et al.

(10) Patent No.: US 8,642,998 B2
(45) Date of Patent: Feb. 4, 2014

(54) ARRAY OF QUANTUM SYSTEMS IN A CAVITY FOR QUANTUM COMPUTING

(75) Inventors: Jay M. Gambetta, Yorktown Heights, NY (US); Mark B. Ketchen, Hadley, MA (US); Chad T. Rigetti, Hopewell Junction, NY (US); Matthias Steffen, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 13/224,765

(22) Filed: Sep. 2, 2011

(65) Prior Publication Data

US 2012/0319085 A1    Dec. 20, 2012

Related U.S. Application Data

(60) Provisional application No. 61/497,018, filed on Jun. 14, 2011.

(51) Int. Cl.
*H01L 29/06* (2006.01)
*H03K 19/195* (2006.01)

(52) U.S. Cl.
USPC .................................. 257/31; 326/4

(58) Field of Classification Search
USPC ...................... 257/31, 34; 326/3–5
See application file for complete search history.

(56) References Cited

U.S. PATENT DOCUMENTS

| | | | |
|---|---|---|---|
| 6,900,454 B2 | 5/2005 | Blais et al. | |
| 6,911,664 B2 * | 6/2005 | Il'ichev et al. | 257/31 |
| 7,042,005 B2 * | 5/2006 | Il'ichev et al. | 257/31 |
| 7,253,654 B2 | 8/2007 | Amin | |
| 7,307,275 B2 | 12/2007 | Lidar et al. | |
| 7,364,923 B2 | 4/2008 | Lidar et al. | |
| 7,533,068 B2 | 5/2009 | Maassen van den Brink et al. | |
| 7,800,395 B2 | 9/2010 | Johnson et al. | |
| 7,876,248 B2 | 1/2011 | Berkley et al. | |
| 8,111,083 B1 * | 2/2012 | Pesetski et al. | 326/3 |
| 2003/0193097 A1 * | 10/2003 | Il'ichev et al. | 257/E27.007 |
| 2004/0140537 A1 * | 7/2004 | Il'ichev et al. | 257/661 |
| 2005/0224784 A1 * | 10/2005 | Amin et al. | 257/14 |
| 2006/0179029 A1 * | 8/2006 | Vala et al. | 706/62 |
| 2007/0215862 A1 * | 9/2007 | Beausoleil et al. | 257/31 |
| 2008/0274898 A1 | 11/2008 | Johnson et al. | |
| 2009/0028340 A1 | 1/2009 | Trifonov | |
| 2009/0074355 A1 * | 3/2009 | Beausoleil et al. | 385/27 |
| 2009/0289638 A1 | 11/2009 | Farinelli et al. | |
| 2010/0241780 A1 | 9/2010 | Friesen | |
| 2012/0319085 A1 * | 12/2012 | Gambetta et al. | 257/31 |
| 2012/0319684 A1 * | 12/2012 | Gambetta et al. | 324/304 |
| 2012/0326720 A1 * | 12/2012 | Gambetta et al. | 324/307 |

OTHER PUBLICATIONS

Houck et al., Life after charge noise: recent results with transmon qubits, Quantum Inf Process, 2009, pp. 105-115.*

(Continued)

*Primary Examiner* — David Vu
*Assistant Examiner* — Earl Taylor
(74) *Attorney, Agent, or Firm* — Cantor Colburn LLP; Vazken Alexanian

(57) ABSTRACT

A device includes a volume bounded by electromagnetically conducting walls, an aperture in a bounding wall of the electromagnetically conducting walls, a plurality of quantum systems disposed within the volume and an electromagnetic field source coupled to the volume via the aperture.

25 Claims, 4 Drawing Sheets

(56) References Cited

OTHER PUBLICATIONS

Houck et al., Controlling the Spontaneous Emission of a Superconducting Transmon Qubit, Physical Review Letters, 101, 080502, 2008, pp. 1-4.*

Koch et al., Charge insensitive qubit design derived from the Cooper pair box, Physical Review A, 76, 042319, 2007, pp. 1-19.*

International Search Report and Written Opinion for International Application No. PCT/US12/36440 filed May 4, 2012.

International Search Report and Written Opinion for International Application No. PCT/US12/36442 filed May 4, 2012.

E. Collin et al. "NMR-like Control of a Quantum Bit Superconducting Circuit," Phys. Rev. Lett. 93, 2004, 157005, 4 pages.

L. DiCarlo et al., "Preparation and Measurement of Three-Qubit Entanglement in a Superconducting Circuit," Nature, vol. 467, 2010, pp. 574-578.

F. Helmer et al., "Cavity grid for scalable quantum computation with superconducting circuits," Europhysics Letters. vol. 85, No. 5, 2009, 50007, 6 pages.

H. Paik et al., "Investigating decoherence in the transmon qubit using a 3D resonator," Bulletin of the American Physical Society, vol. 56, No. 1, Mar. 21-25, 2011, Abstract Y29.00001.

C. Rigetti et al., "Fully Microwave-Tunable Universal Gates in Superconducting Qubits with Linear Couplings and Fixed Transition Frequencies," Phys. Rev. B., vol. 81, 2010, 134507, 7 pages.

C. Rigetti et al., "Protocol for universal gates in optimally biased superconducting qubits," Phys. Rev. Lett., vol. 94, 2005, 240502, 4 pages.

* cited by examiner

US 8,642,998 B2

ARRAY OF QUANTUM SYSTEMS IN A CAVITY FOR QUANTUM COMPUTING

CROSS-REFERENCE TO RELATED APPLICATIONS

Priority based on U.S. Provisional Patent Application, Ser. No. 61/497,018, filed Jun. 14, 2011, and entitled, "ARRAY OF THREE DIMENSIONAL SUPERCONDUCTING QUBIT/CAVITY CLUSTERS FOR QUANTUM COMPUTING", is claimed, the disclosure of which is incorporated by reference herein in its entirety. This application is related to co-pending U.S Pat. applications entitled "MODULAR ARRAY OF FIXED-COUPLING QUANTUM SYSTEMS FOR QUANTUM INFORMATION PROCESSING", filed on Sep. 2, 2011, having and accorded Ser. No. 13/224768, which is entirely incorporated herein by reference.

BACKGROUND

The present invention relates generally to quantum systems and more particularly to an array of quantum systems within a volume bounded by conducting walls with applications to quantum information processing.

Quantum information processing is new paradigm of information processing wherein explicit quantum mechanical states and quantum mechanical phenomena and behavior are exploited for information processing applications. This feat is enabled by several peculiar properties found in quantum systems that are impossible to achieve in classical systems: the ability for a quantum system to be in a superposition of several of its eigenstates and the ability for several quantum systems to be entangled with one another. As such, quantum physics provides a basis for achieving computational power to address certain categories of mathematical problems that are intractable with current machine computation. Similarly to a classical bit where the state of a transistor in a processor, the magnetization of a surface in a hard disk and the presence of current in a cable can all be used to represent bits in the same computer, qubits represent different states. However, for a classical bit it is understood that its state must be 0 or 1. A qubit can be 0 or 1 or a superposition of both.

Several types of physical systems are possibly best suited for building a quantum computer. Such physical systems include, but are not limited to: silicon-based nuclear spins, trapped ions, cavity quantum-electrodynamics, nuclear spins, electron spins in quantum dots, superconducting loops and Josephson junctions, liquid state nuclear magnetic resonance (NMR), and electrons suspended above the surface of liquid Helium.

Historically, a liquid state NMR quantum computer (NMRQC) was the first physical system demonstrating many of the main concepts of quantum computing. In such a system the nuclear spins are placed in a strong magnetic field, creating "up" and "down" states of the nuclear spin (similar to a bar magnet) representing the logical $|0\rangle$ and $|1\rangle$ states. Subsequent quantum algorithms were identified allowing implementation of a three-qubit quantum search algorithm, a five-qubit order finding algorithm, the realization of an adiabatic quantum optimization algorithm, and a demonstration of Shor's factoring algorithm (factoring the number 15 using a 7-spin molecule). FIG. 1 illustrates a prior art NMR seven-spin molecule used to factor the number 15 into its prime factors 3 and 5. The NMRQC is very well-characterized and has several advantages including the seven spin states. However, NMRQC has several drawbacks including qubit systems limited to those nature naturally provides and also limited scalability. Currently, several types of physical systems are being pursued for quantum computing, including implementation of Josephson Junctions, superconducting loops, superconducting capacitors, and superconducting qubits. In addition to various approaches based on superconducting qubits, the most active areas of research involve trapped ions, and quantum dots. The largest quantum computer built in any of these systems to date consists of around 10 qubits, and most implementations are focused on the demonstration of a specific quantum algorithm or quantum state. However, there remain limitations on the number of collections of superconducting qubits possible in current physical systems.

SUMMARY

Exemplary embodiments include a device, including a volume bounded by electromagnetically conducting walls, an aperture in a bounding wall of the electromagnetically conducting walls, a plurality of quantum systems disposed within the volume and an electromagnetic field source coupled to the volume via the aperture.

Additional exemplary embodiments include an apparatus, including a volume bounded by conductive surfaces having an aperture, an arrangement of quantum systems disposed within the volume and an electromagnetic field source coupled to the volume.

Further exemplary embodiments include a qubit apparatus, including a housing defining a cavity therein, a plurality of qubit devices arranged in the cavity and an electromagnetic field source coupled to the housing and configured to apply an electromagnetic field within the cavity.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
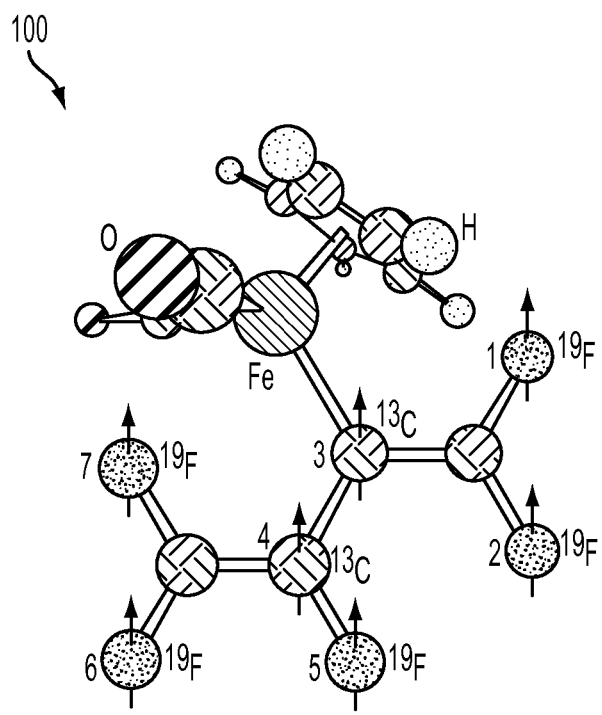
FIG. 1 illustrates a prior art NMR seven-spin molecule.

In exemplary embodiments, the systems and methods described herein implement large collections (e.g., on the order of thousands and more) of coupled superconducting qubits that can be used for quantum computing applications. In exemplary embodiments, any suitable physical qubit system can be implemented. For example, any two-level system can be used as a qubit. Multilevel systems can be used as well, if they possess two states that can be effectively decoupled from the rest (e.g., ground state and first excited state of a nonlinear oscillator). Such systems can include but are not limited to: silicon-based nuclear spins, trapped ions, cavity quantum-electrodynamics, nuclear spins, electron spins in quantum dots, superconducting loops and Josephson junctions, liquid state NMR, and electrons suspended above the surface of liquid Helium.

There are several quantum mechanical properties that are considered in building quantum computers. One distinguishing feature between a qubit and a classical bit is that multiple qubits can exhibit quantum entanglement, which is a nonlocal property that allows a set of qubits to express higher correlation than is possible in classical systems. Take, for example, two entangled qubits in the Bell state, which is called an equal superposition. Entanglement also allows multiple states (i.e., the Bell state mentioned above) to be acted on simultaneously, unlike classical bits that can only have one value at a time. Entanglement is a necessary ingredient of any quantum computation that cannot be done efficiently on a classical computer. Many of the successes of quantum computation and communication, such as quantum teleportation and superdense coding, make use of entanglement, suggesting that entanglement is a resource that is unique to quantum computation. Another quantum mechanical property is quantum teleportation, or entanglement-assisted teleportation, which is a process by which a qubit state can be transmitted exactly (in principle) from one location to another, without the qubit being transmitted through the intervening space. It is useful for quantum information processing; however, it does not immediately transmit classical information, and therefore cannot be used for communication at superluminal (faster than light) speed. Quantum teleportation is unrelated to the common term teleportation—it does not transport the system itself, and does not concern rearranging particles to copy the form of an object.

The requirements for building a practical quantum computer are more intricate than quantum mechanical properties such as superposition and entanglement alone. There is a set of requirements that must be fulfilled in order to build a practical quantum computer. One requirement is to have a system of qubits that can be initialized to a known state. Another requirement is the ability to manipulate this state by applying single and multi-qubit gate operations such that any arbitrary logic operation can be implemented. Finally, the outcome of the computation must be measured through known techniques. In addition, for a quantum system to retain the delicately created superposition and entangled states for sufficiently long times (i.e., coherence times) it must be well isolated from the environment. However, in order to manipulate the quantum system according to the steps of the desired algorithm it must inherently also be coupled to the external environment thereby introducing noise mechanisms that reduce coherence times.

However, as described herein, significant research has been conducted on the NMRQC. The exemplary systems and methods described herein implement a cluster of qubits that behave and can be characterized much like an NMRQC. As such, in characterizing the exemplary systems and methods, several features of the NMRQC can be analyzed as further described herein.

In exemplary embodiments the systems and methods described herein include a housing or volume having a cavity defined within the housing or volume. Quantum systems are disposed within the cavity and can be coupled to one another by electromagnetic field modes excited by an electromagnetic field source. In exemplary embodiments, the cavity includes resonant modes that are each characterized by a resonant frequency. In addition, the quantum systems include a number of eignstates, which have an associated frequency. The electromagnetic field has a number of modes, such that each quantum system can couple to other quantum systems via the mutual coupling of the of the quantum systems to the electromagnetic field.

It will be appreciated that the quantum systems can be any variety of devices that can support qubits for information processing, such as electronic circuits (e.g., Josephson junctions). The quantum systems can represent composite quantum systems, formed for example by a resonant mode of the cavity and the plurality of quantum systems. In exemplary embodiments, the electromagnetic field source is configured to induce a measurement of an eigenstate of at least one of one or more of the quantum systems and the composite quantum systems. In addition, the electromagnetic field source is configured to induce transitions between eigenstates among the plurality of quantum systems. As such, each quantum system has an associated transition frequency that enables the quantum system to transition between eignstates when induced with different modes of the electromagnetic field.

Figure 2:
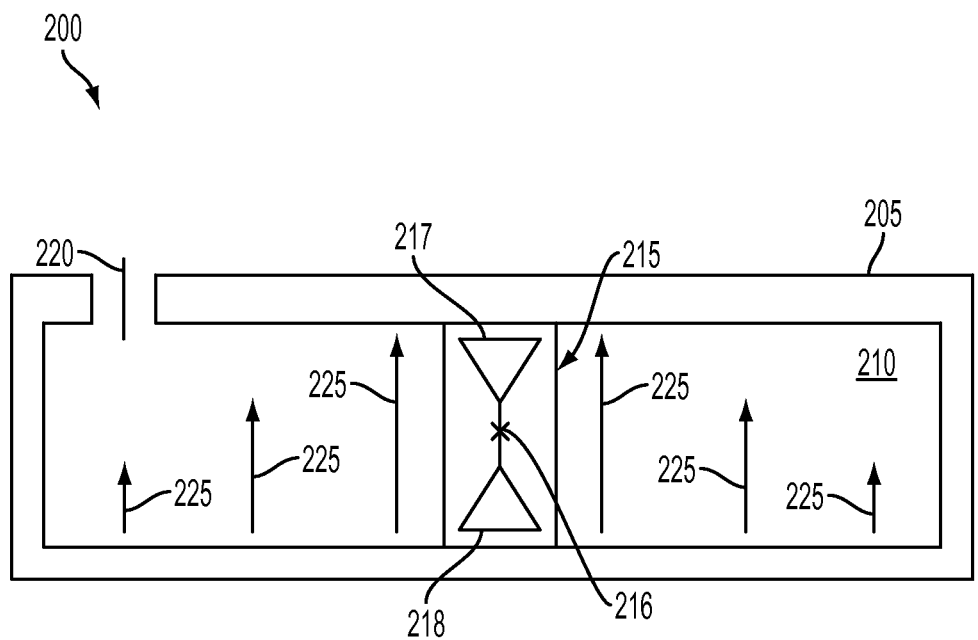
FIG. 2 illustrates an example of a qubit apparatus.

FIG. 2 illustrates an example of a qubit apparatus 200. The apparatus 200 provides an illustrative basis for describing the exemplary systems and methods herein. The apparatus includes a housing 205 with a cavity 210 defined therein. The apparatus 200 can further include a qubit 215 disposed within the cavity 210. The apparatus 200 can further include an external electromagnetic source 220 (e.g., a coaxial cable) coupled to the housing 205 and providing an electromagnetic field, represented by arrows 225. As such, it can be appreciated that the housing 205 is an electromagnetic waveguide for the electromagnetic field applied to the housing. It can further be appreciated that the housing 205 can support several modes of the electromagnetic field. For illustrative purposes, the qubit 215 is circuit having a Josephson junction 216 defined with other circuit elements 217, 218 such as capacitors and inductors as known in the art. The qubit 215 can be advantageously coupled to a transmission line or other suitable connector (not shown) configured to measure the quantum state induced in the qubit 215 from the electromagnetic field. Measurements can be performed by applying signals to the cavity 210 through an interconnect and looking at either the reflected or transmitted signals. If measuring in transmission, a second port—(an output port) can be added. If measuring in reflection, measurements can be made via the port supporting the external magnetic source 220. For further illustrative purposes, the housing 205 can be any suitable superconducting material such as aluminum (Al) and the qubit 215 can be a transom-style superconducting Josephson junction. A transom qubit is a superconducting qubit that is made insensitive to charge by making the qubit capacitance large. By adjusting the capacitance and Josephson inductance (both are determined through fabrication and device geometry), the characteristic energies associated with the qubit capacitance (Ec) and qubit inductance (Ej) satisfy Ej>>Ec. It can be appreciated that other types of qubits are contemplated in other exemplary embodiments. The apparatus 200 can therefore be a three-dimensional waveguide cavity and qubit that form a valid circuit quantum electrodynamic (cQED) system capable of coherence times in the 50 µs range. Coherence times in this range are desirable for the cQED system to retain the delicately created superposition and entangled states as further described herein. Current cQED systems typically implement coplanar waveguide resonators and planar qubits with interdigitated capacitors. In exemplary embodiments, the apparatus 200 is three dimensional in terms of both its physical structure and the associated electromagnetic (EM) fields to which the qubit 215 is coupled.

Several observations can be made of the apparatus 200. First, the electromagnetic modes occupy a free-space region defined by cavity 210. The mode volumes can be considered large with respect to the cavity 210, but also well-defined and have predictable quality factors and frequencies. For example, measurements indicate that the modes are entirely controlled up to our maximum characterization frequency of 27 GHz. The presence of only understood and predictable modes that occupy a free-space region means the possible sources of loss within the system are far more limited than in the planar geometry. By placing the qubit 215 inside the cavity 210, the profile and location of the electromagnetic fields associated with the qubit mode can be adjusted in addition to the electromagnetic field modes. It can be appreciated that appropriate modifications have to be made to the geometry of the qubit capacitance to obtain suitable shunting and coupling capacitances.

In addition, the internal quality factor (i.e., Q factor) of the apparatus has been measured to be as high as 4.4 million. The Q factor characterizes a resonator's bandwidth relative to its center frequency. Higher Q indicates a lower rate of energy loss relative to the stored energy of the cavity 210, and thus the oscillations die out more slowly. Furthermore, the Q factor is easily tuned and can be increased for readout performance or for Purcell Effect qubit relaxation. The Purcell Effect in this case defines the rate at which the qubits relax (i.e., lose their current quantum state). For example, the apparatus has been measured to have a Purcell-limited qubit lifetime of 2.7 µs in the cavity 210 with a loaded Q of 20,000. In addition, the coupling factor, g, between the qubit and the cavity 210 has been measured to be g=475 MHz. Such coupling indicates a strong interaction between the cavity 210 and the qubit 215. As such, the applied electromagnetic field can easily adjust the quantum state of the qubit 215, which in turn will relax slow enough to allow for suitable measurement. Such measurements indicate that many-qubit systems as described herein can provide meaningful measurements for quantum computing to perform high-fidelity multi-qubit logic.

The apparatus 200 of FIG. 2 is a single three-dimensional (3D) configuration in that the coupling of the qubit 215 to the electromagnetic field in the cavity 210 occurs in three dimensions. In exemplary embodiments, the single 3D qubit 215 of FIG. 2 can be scaled up to a larger array of coupled 3D qubits for quantum computing as now described.

Figure 3:
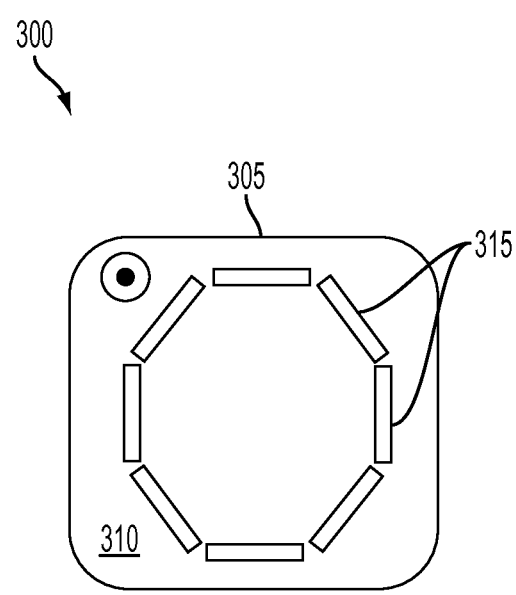
FIG. 3 illustrates an example of an exemplary three dimensional qubit cluster apparatus.

FIG. 3 illustrates an example of an exemplary 3D qubit cluster apparatus 300. The apparatus 300 includes a housing 305 with a cavity 310 defined therein. The apparatus 300 can further include a cluster of qubits 315 disposed within the cavity 310. As described herein, an example of a superconducting Josephson junction is described as each of the qubits 315. However, as described herein, it is appreciated that any type of qubit can be implemented including, but not limited to, quantum dots, electron or nuclear spins or collections thereof. The apparatus 300 can further include an external electromagnetic source 320 (e.g., a coaxial cable) coupled to the housing 305 and providing an electromagnetic field within the cavity 310. As such, it can be appreciated that the housing 205 is an electromagnetic waveguide for the electromagnetic field applied to the housing 305. The qubits 315 can be arranged in a wide variety of ways within the cavity 310. The location and orientation of a qubit within the cavity can affect how strongly coupled it is to the modes of the cavity. Each qubit 315 can be viewed as a dipole, with an associated dipole moment vector. The strength of its interaction with the cavity 310 is determined predominantly by the dot product of the dipole moment vector with the electric field vector at the location of the qubit 315. As such, adjustments of the qubit location and orientation relative to the electric field profile of the mode of interest can be used to adjust the strength of qubit-cavity coupling, and in turn the qubit-qubit coupling, as the qubits acquire a direct qubit-qubit effective interaction through their mutual interaction with the cavity mode. The apparatus 300 exhibits similar physical qualities as the apparatus described with respect to FIG. 2. The apparatus 300 is thus a scaled apparatus including multiple qubits 315. As such, the cavity 310 can support a high volume of electromagnetic modes, with strong coupling between the cavity 310 and the qubits. Furthermore, there is also strong coupling among the individual qubits 315 within the cavity that can be controlled and tuned by adjusting the electromagnetic field from the electromagnetic source 320. The apparatus 300 is therefore scaled up from the single 3D qubit to a large platform of coupled 3D qubits for quantum computing. In exemplary embodiments, the scaling up process is modular. FIG. 3 illustrates a single qubit cluster 300 as described. In exemplary embodiments, eight qubits 315 are illustrated and can be arranged in a variety of ways in order to achieve desired coupling among the qubits. It will be appreciated that there are numerous ways and manners in which the qubits 315 can couple. The qubits 315 are illustrated in an octagonal pattern but in no way are other exemplary embodiments limited to this pattern. Furthermore, there can be fewer or more than eight qubits 315 arranged in the cavity 310. Eight qubits 315 are illustrated because they behave much like a conventional NMR molecule, as further described herein, and therefore are well-understood and characterized.

As such, FIG. 3 illustrates eight transom-style qubits inside the cavity 315, which, as described is an ultra-high Q superconducting waveguide resonator, to form the qubit cluster apparatus 300.

In exemplary embodiments, as described herein, the coupling of qubits within a cluster as well can be achieved by the application of electromagnetic fields. Measurements of the qubits can be subsequently taken in order to determine the quantum states of the qubits. The application of the electromagnetic fields as well as the subsequent quantum state measurements described an overall quantum computing method. First all the qubits within the cluster are characterized in terms of their frequencies $f_i$ and coupling strengths $g_i$ to the cavity by known techniques. Through an iterative process with this qubit characterization joint readout of the qubits is then calibrated. With the values of $f_i$ and $g_i$, the Hamiltonian H of the qubit/cavity system can then be reconstructed. And protocols for a universal gate set devised—consisting of rf pulse sequences. In parallel an algorithm to be implemented is selected and decomposed into a set of single and multiple gate operations consistent with the resources available in the cluster. A set of rf pulse sequences is then devised to implement the algorithm based on those determined for the universal gate set. These RF pulse sequences are next applied to the system and a joint readout of all the qubits is done to determine the outcome.

Several properties of the exemplary systems and methods are now further described. As discussed herein, the physics of a system with multiple transmon style qubits dispersively coupled to a single bosonic resonator mode is well understood (e.g., an NMRQC). In exemplary embodiments, the systems and methods described herein are implemented with fixed qubit frequencies and fixed qubit-qubit coupling. In this way, known NMR control techniques can be implemented. In NMR technology, Larmor frequencies are implemented in which the qubits tend to align with the applied electromagnetic fields. In addition, chemical shifts, which describe the dependence of energy levels in on the electronic environment in a molecule, can be implemented to determine the dependence of the energy levels in a given cavity in the exemplary qubit clusters described herein. By implementing such known techniques, universal control of the exemplary qubit clusters described herein can be attained. In exemplary embodiments, qubit frequencies could be controlled via wires introduced into the cavity. By judicious selection of qubit frequencies and anharmonicities, Hamiltonians identical to Hamiltonians in NMR can be attained, where there are both secular and non-secular coupling terms of comparable strength, but only the secular portion is important because it enters to first order in perturbation theory. In exemplary embodiments, spins can be selected on individual qubits within a cavity.

In NMRQC, ZZ exchange and interaction describes the spin exchange between adjacent molecules. This concept can be extended to describe spin exchange in qubits as described in exemplary embodiments. An NMR-style Hamiltonian emerges when the effective ZZ interaction between qubits in a particular cavity is significant compared with the off-diagonal J-coupling term, that is, coupling of angular momentum of interacting qubits. This ZZ interaction has two physical origins. First, ZZ interaction emerges in the two-level approximation when the cavity-qubit coupling is treated to fourth-order in perturbation theory. Second, it emerges when additional qubit levels outside the computational subspace are properly modeled. The two effects can be made to add rather than cancel. In exemplary embodiments, the systems and methods described herein that include circuits that implement an NMR-type Hamiltonian requires understanding and exploiting both these origins of the ZZ interaction term. The strength of the effect increases rapidly as the 1-->2 transition of one qubit in a cluster approaches the 0-->1 transition of another. By exploiting these physical phenomena, the qubit clusters described herein can be scaled as described.

In exemplary embodiment, in order to produce the NMR-type Hamiltonian characterized by: a) fixed qubit transition frequencies, and b) fixed qubit-qubit couplings dominated by a ZZ interaction, the systems described herein possess the following qualities: 1) Each qubit is controlled and manipulated in such a manner that it behaves as an effective two-level system; 2) Each qubit interacts with at least one other qubit with a coupling energy that is much greater than the qubit relaxation and decoherence rates; 3) The system allows for the application to the qubits of a frequency and amplitude modulated microwave control field; and 4) The system allows for the readout of the quantum state of all qubits such as joint readout via reflection or transmission.

In exemplary embodiments, two qubit gates are performed by doing nothing to the two qubits that are to be entangled, while interactions between all other pairs are refocused. In recent liquid state NMR experiments on multi-spin molecules, very-high fidelity control of $E_{1q}=1.3\times10^{-4}$ and $E_{2q}=4.7\times10^{-3}$ has been demonstrated. It is believed that these are limited by the difficulty to polarize the spins at the outset. In contrast, in exemplary embodiments, the qubits described herein (i.e., superconducting qubits can be easily initialized. However, due to the higher Larmor frequencies (roughly 1-10 GHz as compared to 50-500 MHz), additional steps must be taken to carry out accurate numerical pulse optimization.

In exemplary embodiments, qubits within the exemplary cluster described herein are measured through the application of resonant or near-resonant signals to the cavity that houses them. The readouts can be done according to the established methods of joint dispersive readout. Single shot readouts can be realized by also applying drive signals to a neighboring coupling element, whose non-linearity makes it suitable for signal amplification.

As such, it can be appreciated that the exemplary cluster described herein combines known and well-characterized features of NMRQC and desirable attributes of qubits such as superconducting attributes.

Figure 4:
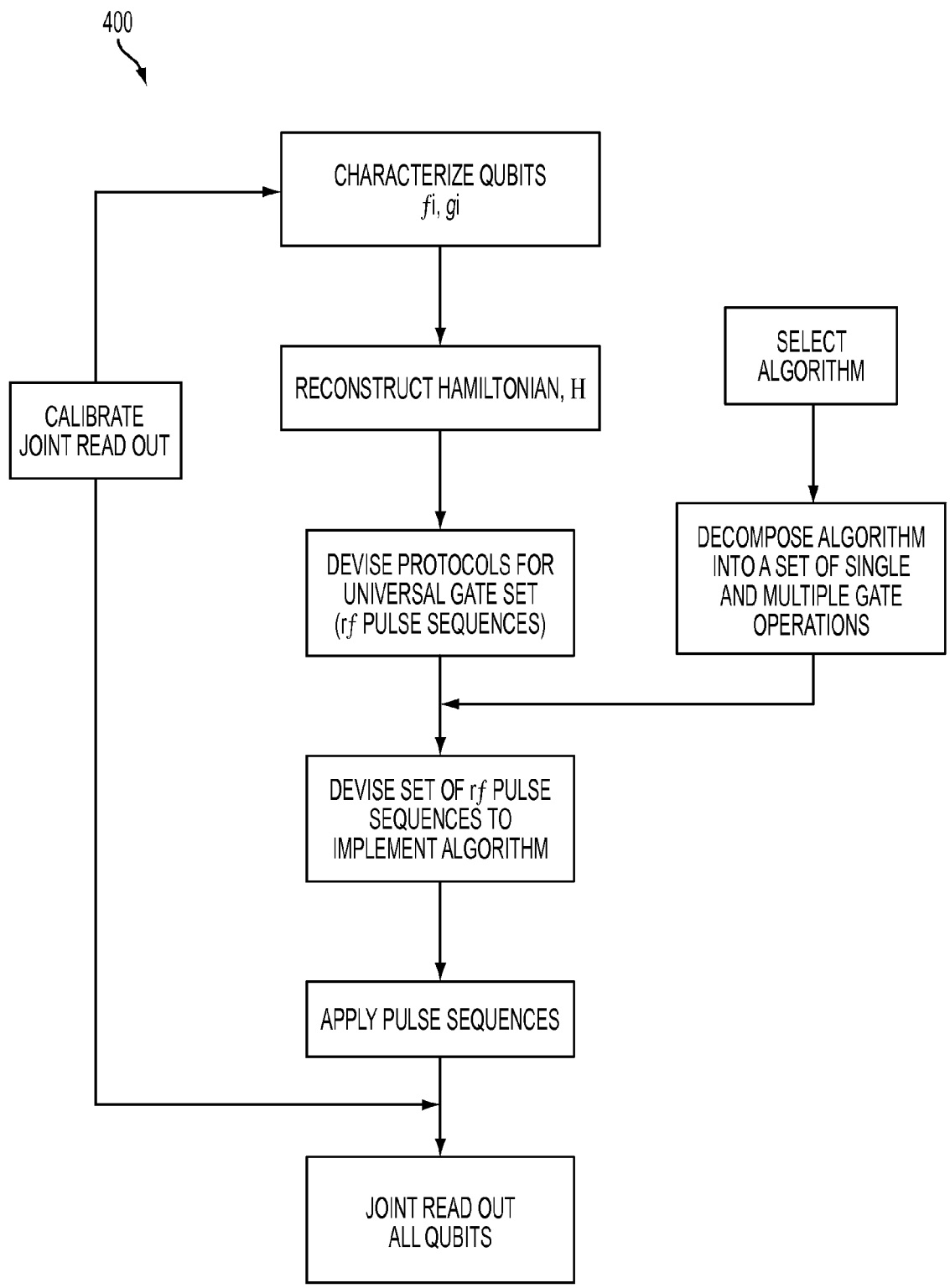
FIG. 4 illustrates a flow chart of a method for a quantum computing method in accordance with exemplary embodiments.

In exemplary embodiments, as described herein, the coupling of qubits within a cluster as well can be achieved by the application of electromagnetic fields. Measurements of the qubits can be subsequently taken in order to determine the quantum states of the qubits. The application of the electromagnetic fields as well as the subsequent quantum state measurements described an overall quantum computing method. FIG. 4 illustrates a flow chart of a method 400 for a quantum computing method in accordance with exemplary embodiments. First all the qubits within the cluster are characterized in terms of their frequencies $f_i$ and coupling strengths $g_i$ to the cavity by known techniques. Through an iterative process with this qubit characterization joint readout of the qubits is then calibrated. With the values of $f_i$ and $g_i$ the Hamiltonian H of the qubit/cavity system can then be reconstructed. And protocols for a universal gate set devised—consisting of rf pulse sequences. In parallel an algorithm to be implemented is selected and decomposed into a set of single and multiple gate operations consistent with the resources available in the cluster. A set of rf pulse sequences is then devised to implement the algorithm based on those determined for the universal gate set. These rf pulse sequences are next applied to the system and a joint readout of all the qubits is done to determine the outcome.

The flow diagram depicted herein is just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A device, comprising:
   a volume bounded by electromagnetically conducting walls;
   an aperture in a bounding wall of the electromagnetically conducting walls;
   a plurality of quantum systems disposed within the volume; and
   an electromagnetic field source coupled to the volume via the aperture,
   wherein each of the plurality of quantum systems is arranged at a location in the volume, which is relative to an electric field profile of a mode of interest from the electromagnetic filed source, the location determining coupling strength between each of the plurality of quantum systems to the cavity and to other quantum systems.

2. The device as claimed in claim 1 wherein the volume supports a plurality of electromagnetic resonant modes, each of the plurality of resonant modes characterized by a resonant frequency.

3. The device as claimed in claim 1 wherein each of the plurality of quantum systems includes a plurality of eignestates.

4. The device as claimed in claim 1 wherein the electromagnetic field source produces an electromagnetic field within the volume.

5. The device as claimed in claim 1 wherein a plurality of the quantum systems disposed within the volume is coupled to the electromagnetic field within the volume.

6. The device as claimed in claim 5 wherein a particular quantum system from among the plurality disposed within the volume interacts with a different particular quantum system from among the plurality disposed within the volume by way of the electromagnetic field within the volume.

7. The device as claimed in claim 2 wherein a particular quantum system from among the plurality disposed within the volume interacts with a different particular quantum system from among the plurality disposed within the volume by way of the electromagnetic resonant modes supported by the bounded volume.

8. The device as claimed in claim 1 wherein each of the plurality of quantum systems is an electronic circuit.

9. The device as claimed in claim 8 wherein each of the plurality of quantum systems includes a Josephson junction.

10. The device as claimed in claim 1 wherein each of the plurality of quantum systems is a qubit.

11. The device as claimed in claim 1 wherein each of the plurality of quantum systems is a composite quantum system.

12. The device as claimed in claim 1 wherein a resonant mode of the cavity and the plurality of quantum systems is a composite quantum system.

13. The device as claimed in claim 1 wherein the electromagnetic field source is configured to induce a measurement of an eigenstate of at least one of one or more of the plurality of quantum systems and the composite quantum system.

14. The device as claimed in claim 1 wherein the electromagnetic field source is configured to induce an electromagnetic field within the cavity.

15. The device as claimed in claim 14 wherein each of the plurality of quantum systems includes a transition frequency.

16. The device as claimed in claim 15 wherein the electromagnetic field source is configured to induce transitions between eigenstates among the plurality of quantum systems.

17. The device as claimed in claim 15 wherein the electromagnetic field source is configured to induce transitions between eigenstates of one or more quantum systems among the plurality of quantum systems.

18. The array as claimed in claim 2 wherein each of the one or more quantum states includes a measurable feature.

19. The array as claimed in claim 1 wherein the housing is a closed section of electromagnetic waveguide.

20. The array as claimed in claim 1 wherein each of the plurality of quantum systems is a transmon-style superconducting qubit.

21. The device as claimed in claim 2 wherein the electromagnetic field source is configured to induce an electromagnetic field within the cavity at one or more of the resonant frequencies associated with the volume.

22. An apparatus, comprising:
a volume bounded by conductive surfaces having an aperture;
an arrangement of quantum systems disposed within the volume; and
an electromagnetic field source coupled to the volume,
wherein individual quantum systems from the arrangement of quantum systems is arranged at a location in the volume, which is relative to an electric field profile of a mode of interest from the electromagnetic filed source, the location determining coupling strength between individual quantum systems to the volume and to other individual quantum systems.

23. The apparatus as claimed in claim 22 wherein an electromagnetic field generated from the electromagnetic field source within the volume is applied through the aperture.

24. An qubit apparatus, comprising:
a housing defining a cavity therein;
a plurality of qubit devices arranged in the cavity; and
an electromagnetic field source coupled to the housing and configured to apply an electromagnetic field within the cavity,
wherein each of the plurality of qubit devices is arranged at a location in the cavity, which is relative to an electric field profile of a mode of interest from the electromagnetic filed source, the location determining coupling strength between each of the plurality of qubit devices to the cavity and to other qubit devices.

25. The array as claimed in claim 24 wherein each of the plurality of qubits includes a resonance frequency and wherein the electromagnetic field is configured to generate one or more quantum states in each of the plurality of qubits, and wherein the plurality of qubits are arranged in the cavity such that modes associated with each of the plurality of qubits couple with one another.

* * * * *